(12) United States Patent
Cheng

(10) Patent No.: US 10,739,302 B2
(45) Date of Patent: Aug. 11, 2020

(54) BIO AND CHEMICAL SENSOR WITH INCREASED SENSITIVITY

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 15/802,112

(22) Filed: Nov. 2, 2017

(65) Prior Publication Data
US 2019/0128838 A1    May 2, 2019

(51) Int. Cl.
*G01N 27/414* (2006.01)
*H01L 29/51* (2006.01)
*B82Y 15/00* (2011.01)

(52) U.S. Cl.
CPC ............ *G01N 27/414* (2013.01); *B82Y 15/00* (2013.01); *G01N 27/4145* (2013.01); *H01L 29/513* (2013.01); *H01L 29/518* (2013.01)

(58) Field of Classification Search
CPC ............ H01L 29/1054; G01N 27/414
See application file for complete search history.

(56) References Cited

U.S. PATENT DOCUMENTS

| | | |
|---|---|---|
| 7,692,219 B1 | 4/2010 | Holm-Kennedy |
| 8,592,153 B1 | 11/2013 | Bustillo et al. |
| 8,642,371 B2 | 2/2014 | Mohajerzadeh et al. |
| 8,649,840 B2 | 2/2014 | Sheppard, Jr. et al. |
| 8,653,567 B2 | 2/2014 | Fife |
| 9,671,364 B2 | 6/2017 | Shi et al. |
| 2009/0026082 A1 | 1/2009 | Rothberg et al. |
| 2017/0053985 A1* | 2/2017 | Balakrishnan ...... H01L 29/1054 |

OTHER PUBLICATIONS

A. L. Kukla et al., "Toxicity analysis of real water samples of different origin with ISFET multibiosensor," Biochemistry and Biophysics, vol. 2, No. 1, 2014, pp. 7-12.
N. Nikkhoo et al., "Rapid Bacterial Detection via an All-Electronic CMOS Biosensor," PloS one, vol. 11, No. 9, 2016, e0162438.
J. C. van Kerkhof et al., "ISFET Responses on a stepwise change in electrolyte concentration at constant pH," Sensors and Actuators B, vol. 18, No. 1, 1994, pp. 56-59.

* cited by examiner

*Primary Examiner* — Dah-Wei D. Yuan
*Assistant Examiner* — Andrew J Bowman
(74) *Attorney, Agent, or Firm* — Patterson + Sheridan, LLP

(57) ABSTRACT

An ISFET structure and method for creating the same is provided. A device with a substrate is provided, an insulator layer is deposited over the substrate, and a material layer is deposited over the insulator layer, where the material layer can be a membrane, including a porous membrane, which can reduce the parasitic capacitance of a bio-species or chemical that can be applied with the device.

12 Claims, 12 Drawing Sheets

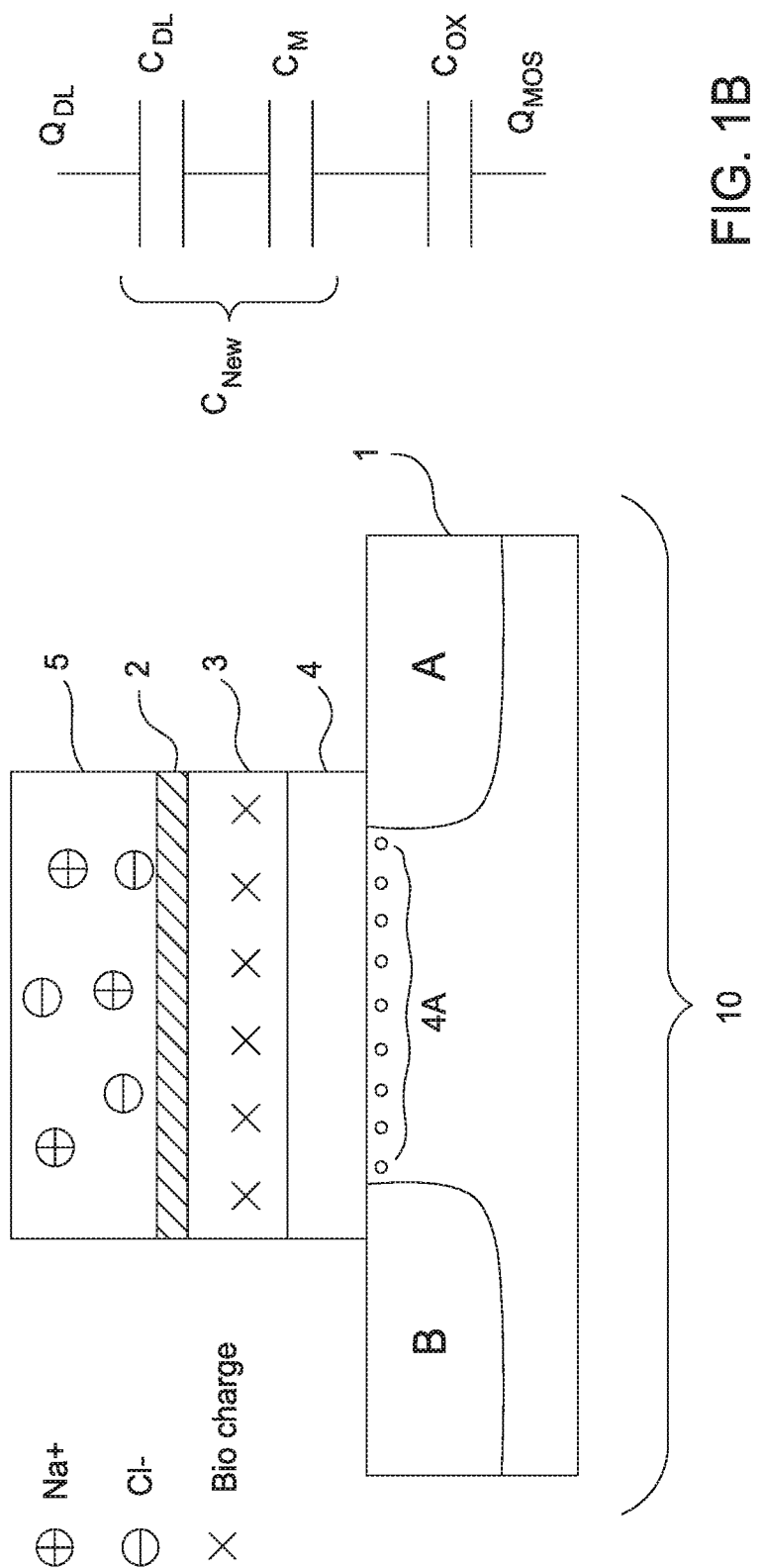

US 10,739,302 B2

BIO AND CHEMICAL SENSOR WITH INCREASED SENSITIVITY

BACKGROUND

1. Technical Field

The present disclosure relates to a semiconductor structure and a method of forming the same. More particularly, the present disclosure relates to an ion-sensitive field-effect transistor (ISFET) device that can be used as a bio or chemical sensor and a method of forming the same.

2. Related Art

An ISFET is a biosensor which operates by sensing a bio-species or chemical (e.g., DNA) on the gate dielectric portion of the ISFET. The charges carried by the bio-species or chemical modulate the electrical current in the channel of the ISFET, and as such, facilitate the sensing associated with the device. Improving the ability of the ISFET to detect the charges improves the ability of ISFET devices to identify the bio-species or chemical being sensed or tested.

SUMMARY

One aspect of the present disclosure includes a substrate with an associated source/drain region, a gate dielectric layer over the substrate, and a porous membrane layer over the gate dielectric layer.

Another aspect of the present invention includes a method for increasing sensitivity of a ISFET device. The method includes providing a substrate, depositing an insulator layer over the substrate, and depositing, over the insulator layer, at least one material layer for reducing a parasitic capacitance associated with a bio-species or chemical solution that can be deposited over the insulator layer.

BRIEF DESCRIPTION OF THE SEVERAL VIEWS OF THE DRAWINGS

FIG. 1A illustrates an ISFET device in accordance with one or more embodiments of the present disclosure.

FIG. 1B illustrates a circuit representation of the capacitance features of certain layers in FIG. 1A.

DETAILED DESCRIPTION

Figure 1C:
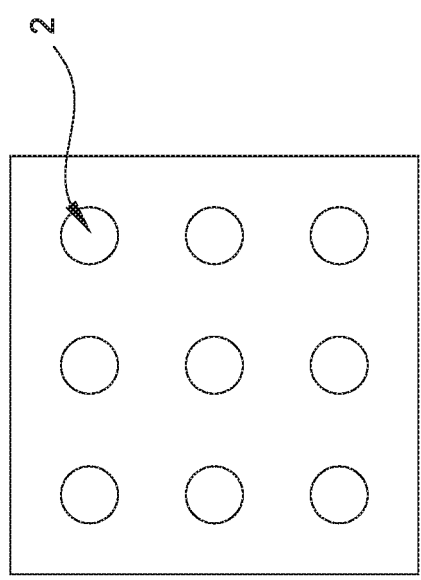
FIG. 1C illustrates a membrane layer in accordance with one embodiment of the present disclosure.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

In one embodiment, ISFET devices sense bio-species or chemical(s) via a channel current. However, the sensitivity of an ISFET can suffer from parasitic capacitance generated by a dispersing solution associated therewith, (e.g., typically a salt based solution). For example, in many bio samples, bio-species are dispersed in a salt-based solution (e.g., NaCl solution), and the Na+ and Cl— of the solution generate a parasitic double-layer (DL) capacitor that siphons away charges intended to travel through the device. Practically, this means that the charges, such as bio-charges associated with a solution containing bio-species, are shared between the gate capacitor of the ISFET and the parasitic double-layer capacitor. Because salt water and other suitable solutions have very high dielectric constants, only a fraction of bio charges are effectively sensed by the ISFET which can have an adverse effect on ISFET detection functions, as well as otherwise adversely affecting device performance and functionality.

The sensitivity relationship amongst charges and layer capacitance(s) can be expressed mathematically with respect to the activity taking place in the channel. As expressed in Equation 1, the bio charge ($Q_b$) is shared between two capacitors, $C_{DL}$ (parasitic double layer capacitance) and $C_{OX}$ (capacitance of gate dielectric, e.g., gate oxide), where the total device charge (that is not absorbed) ($Q_{MOS}$) is proportional to device sensitivity.

$$\text{Sensitivity} \propto Q_{MOS} = Q_b [C_{OX}/(C_{OX}+C_{DL})] \quad \text{(Equation 1)}$$

Accordingly, in addition to other benefits and advantages discussed herein, certain embodiments of the present disclosure address the problems associated with the parasitic double layer capacitance. In one embodiment, a membrane layer is placed over the gate dielectric of the ISFET device to sufficiently mitigate the effects of parasitic capacitance associated with the bio-species or chemical solution. In one embodiment, the bio-species or chemical solution contains matter that has an associated charge, such as a blood sample, DNA sample, or other bio-species matter, and the membrane layer has a plurality of pores associated therewith, where the pores enable the matter associated with charge to travel through the device, while also blocking some or all of the solution from traversing further into the device.

FIG. 1A illustrates a high level view of an ISFET device 10 in accordance with one or more embodiments of the present disclosure. A substrate 1 includes doped source and drain regions. A gate dielectric 4 is disposed on the substrate 1 and a porous membrane layer 2 over the gate dielectric 4, e.g., gate oxide. A solution 5, with associated ions that cause a parasitic capacitance, e.g., sodium and chlorine atoms, is deposited over the dielectric layer 4. The solution 5 carries bio-species with associated charges 3 that travel through the device 10 for sensing. In one embodiment, the channel is adjacent to the interface between the gate dielectric layer 4 and the substrate 1, and thus changes the electrical current flow from the source to drain (not expressly shown here). A portion of the matter associated with charges 3, as shown, changes the electrical potential of the channel 4A for detection, and a portion of charges (not shown) are captured by the parasitic capacitance associated with the ions contained in the solution 5. The porous membrane 2, as discussed herein, mitigates the parasitic capacitance effect. FIG. 1B illustrates a circuit/capacitance configuration for the device in FIG. 1A, which inherently illustrates one of the advantages of FIG. 1A, namely, that the membrane capacitance ($C_M$), which is the capacitance of the membrane layer 2, is in series with the double layer capacitance ($C_{DL}$), which is the parasitic capacitance associated with the solution 5, and as a result, overall parasitic effects are reduced by forming a new overall capacitance ($C_{New}$) in series with the capacitance of the gate dielectric ($C_{ox}$). FIG. 1 C illustrates the porous membrane layer 2 of FIG. 1, where i) the membrane material, e.g., a nitride, ii) the dimensions of the membrane layer 2 and/or iii) pores of the membrane layer 2 can be adjusted to address 1) the effects of parasitic capacitance and 2) flow of the solution (bio-species or chemical with associated charges) landing on top of the gate dielectric 4 of the ISFET device 10. In one embodiment, (not expressly shown here), an inlet and/or outlet is associated with the structure and assists or enables the solution to travel through the structure, and the relevant material to reach the sensor, e.g. land on top of the gate dielectric. In another embodiment, there is a gap associated with the area above the gate dielectric 2 where the deposition of solution will take place. In one embodiment, both a gap and the inlets and outlets can enable transmission of the solution.

According to one embodiment, the porosity of the membrane can be adjusted to enable some of the matter associated with charges, e.g., bio-species, to travel through the membrane while preventing other species from traversing through the membrane to provide a selectivity. In one embodiment, if the solution contains multiple types of bio-species with different sizes, the sizes of holes in the membrane can be adjusted, to permit bio-species with a size smaller than the size of the holes to penetrate through the membrane and to land of the gate dielectric 4 for detection.

Figure 2:
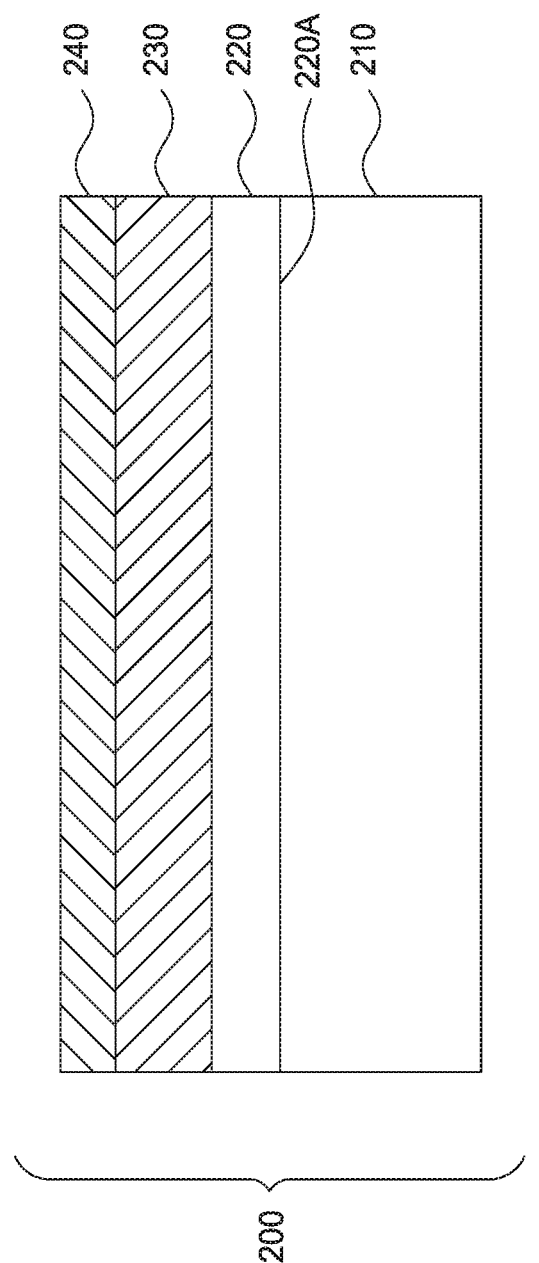
FIG. 2 illustrates a semiconductor device in accordance with at least one embodiment of the present disclosure.

FIG. 2 illustrates a semiconductor structure 200 useful for forming an ISFET device in accordance with the present disclosure. The semiconductor structure 200 includes a substrate 210, a gate dielectric or insulator layer 220 over the substrate 210, a sacrificial layer 230, e.g. can be selectively removed in relation to surrounding layers and materials, over the gate dielectric or insulator layer 220, and a membrane material layer 240 over the sacrificial layer 230. In one embodiment, the layer 230 can be silicon, silicon germanium, germanium. It can also be other materials such as a dielectric, e.g. SiCOH, that can be later removed selective to the surrounding materials. In one embodiment, the layer 230 can be a metallic material, e.g., titanium nitride.

The substrate 210 may include at least one of the following semiconductor materials: silicon (Si), silicon-germanium (SiGe), silicon-carbide (SiC), silicon-germanium carbide (SiGeC), another III-V material, another II-IV material, a compound semiconductor, carbon nanotube, graphene, two-dimensional materials such as two-dimensional molybdenum disulphide (MoS2), or other like semiconductor materials. In addition, multiple layers of the semiconductor materials can be used as the semiconductor material of the substrate 210. The substrate 210 can be a portion of a broader semiconductor substrate structure, and can include any suitable configuration, such as semiconductor-on-insulator (SOI), extremely thin semiconductor-on-insulator (ET-SOI), a bulk substrate, etc. The semiconductor material used for the substrate 210 can be independently single crystalline, polycrystalline, or amorphous. In one embodiment, the substrate 210 is single crystalline or poly crystalline silicon.

The gate dielectric or insulator layer 220 can be any suitable insulating material, including but not limited to an oxide or nitride, including, SiO2, SiN, SiON, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, a silicate thereof, and an alloy thereof. The gate dielectric or insulator layer 220 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the at least one gate dielectric or insulator layer 220 can be formed utilizing a thermal process such as, for example thermal oxidation or thermal nitridation.

Similarly, the sacrificial layer 230 and the membrane material layer 240 can also be formed, as illustrated in FIG. 2, using chemical vapor deposition, (CVD), physical vapor deposition (PVD), molecular beam deposition (MBD), pulsed laser deposition (PLD), liquid source misted chemical deposition (LSMCD), atomic layer deposition (ALD), or any other suitable deposition techniques The sacrificial layer 230 can be any suitable semiconductor material, e.g., a type II, III-V, or IV material, where in one embodiment the sacrificial semiconductor material is silicon-germanium. The membrane material layer 140 can be silicon dioxide, silicon-nitride, SiOCN, or SiBCN, generally dielectric nitrides (e.g., silicon-nitride), dielectric oxynitrides, or any combination thereof. In one embodiment, the membrane material layer is silicon-nitride and is deposited using a CVD or ALD process. In one embodiment, the membrane material layer 240 is silicon-nitride and is deposited using a CVD or ALD process and the sacrificial semiconductor material layer 230 is silicon-germanium deposited in accordance with one the techniques discussed above.

Figure 3:
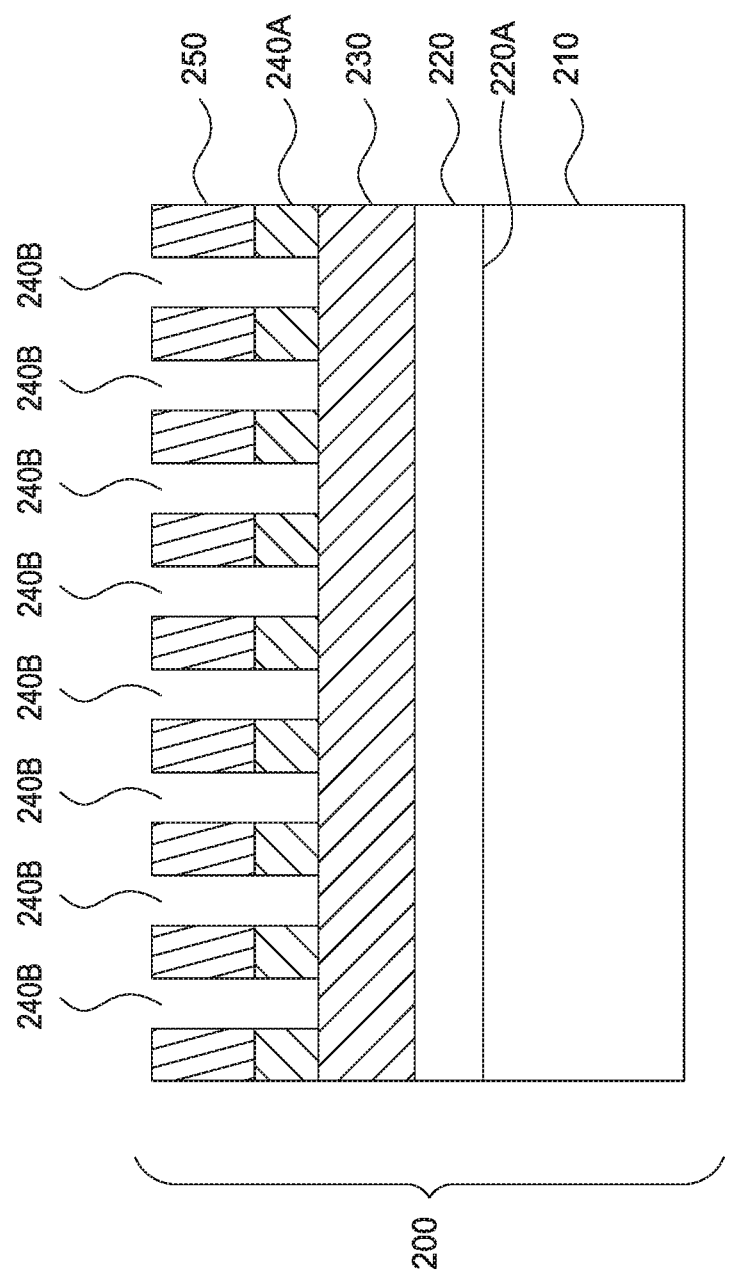
FIG. 3 illustrates a semiconductor device in accordance with at least one embodiment of the present disclosure.

FIG. 3 illustrates a structure 200 with holes or openings 240B on the membrane material layer 240, where the holes 240B can serve one or more purposes, including enabling a bio-species or chemical solution to flow from the solution to gate dielectric 220 for detection and to reduce parasitic capacitance. As shown, a mask 245 is deposited over the membrane material layer 240. The material comprising the mask 245 can include a material suitable as a mask such as, for example, a hard mask material (i.e., an oxide, nitride, and/or oxynitride), a photoresist material or a multilayered stack thereof including, for example a stack of, from bottom to top, a hard mask material and a photoresist material. The mask 245 can be provided by depositing at least one blanket layer of mask material atop the membrane material layer 240, and, if not present as the topmost layer of the at least one blanket layer of mask material, a photoresist material (not shown) can be formed atop the at least one blanket layer of mask material. The photoresist material is then exposed to a desired pattern of radiation, and the exposed resist is developed using a conventional resist developer. The pattern from the patterned photoresist can then be transferred into the at least one blanket layer of mask material by etching.

The etching can include a dry etching process such as, for example, reactive ion etching, plasma etching, and ion etching or laser ablation. The etch process forms the holes 240B associated with the membrane material layer 240, which forms a membrane material layer 240A with multiple holes 240B, e.g., for purposes of discussion in the present disclosure, a porous membrane material layer 240A. The lithography and etch process used to create the holes 240B, e.g., the porosity of the membrane layer 240A, can be adjusted to meet various technical ends, including reducing parasitic capacitance. According to an embodiment, the pore size, opening size, or hole size of the porous membrane material layer can be 5 nm to 100 nm, although smaller or greater hole size is also conceived. For hole sizes suitable for conventional patterning technique, they can be determined by the photolithographic and etch process defined above, and the pitch of the porous material layer can be approximately 100 nm to 1000 nm, although smaller or greater pitches are also conceived. However, the dimensions can be adjusted to achieve specific objectives desired for a particular purpose. In one embodiment, for hole sizes smaller than that can be patterned by the conventional patterning technique, other suitable techniques, for example, directly self-assembling or shrinking techniques can be used to obtain smaller hole sizes.

One embodiment that illustrates a non-limiting example for the usefulness of certain aspects of the present disclosure is as follows: the gate dielectric 220 is a HfO2 layer with a dielectric constant of 20 and thickness of approximately 2 nm, the porous membrane layer 240 is a silicon-nitride layer with a dielectric constant of 7 and a thickness of approximately 2 nm, and the layer of bio-species or chemical solution deposited for sensing over the gate dielectric 220 (not shown) is a salt-water solution (NaCl based) with a dielectric constant of approximately 80 and a thickness of approximately 4 nm. (All dielectric constants mentioned herein are relative to a vacuum, unless otherwise noted.) With these physical characteristics a comparison is shown between a device with the porous membrane layer and one without:

Relative Capacitance (per area and relative terms):

$C_{DL}$(salt water double layer capacitance)=80/4=20

$C_{ox}$(gate dielectric)=20/2=10

$C_M$(membrane)=7/6=1.16

Without the membrane (applying equation 1 and omitting the membrane capacitance):

Sensitivity $\propto Q_{MOS} = Q_b[C_{OX}/(C_{OX}+C_{DL})] \approx \frac{1}{3} Q_b$ (Equation 1)

With the membrane (applying equation 1 and including the membrane capacitance):

Sensitivity $\propto Q_{MOS} = Q_b[C_{OX}/(C_{OX}+C_{New})]$ (Equation 1)

$1/C_{New} = 1/C_{DL} + 1/C_M$, so $C_{New} \approx 1.05$ (Equation 2)

Sensitivity $\propto Q_{MOS} \approx 0.905\, Q_b$

Therefore, as shown, in an operational state, the membrane layer 240A can dramatically improve sensitivity, with the above example demonstrating a threefold improvement in sensing over a device that lacks the membrane layer.

Figure 4:
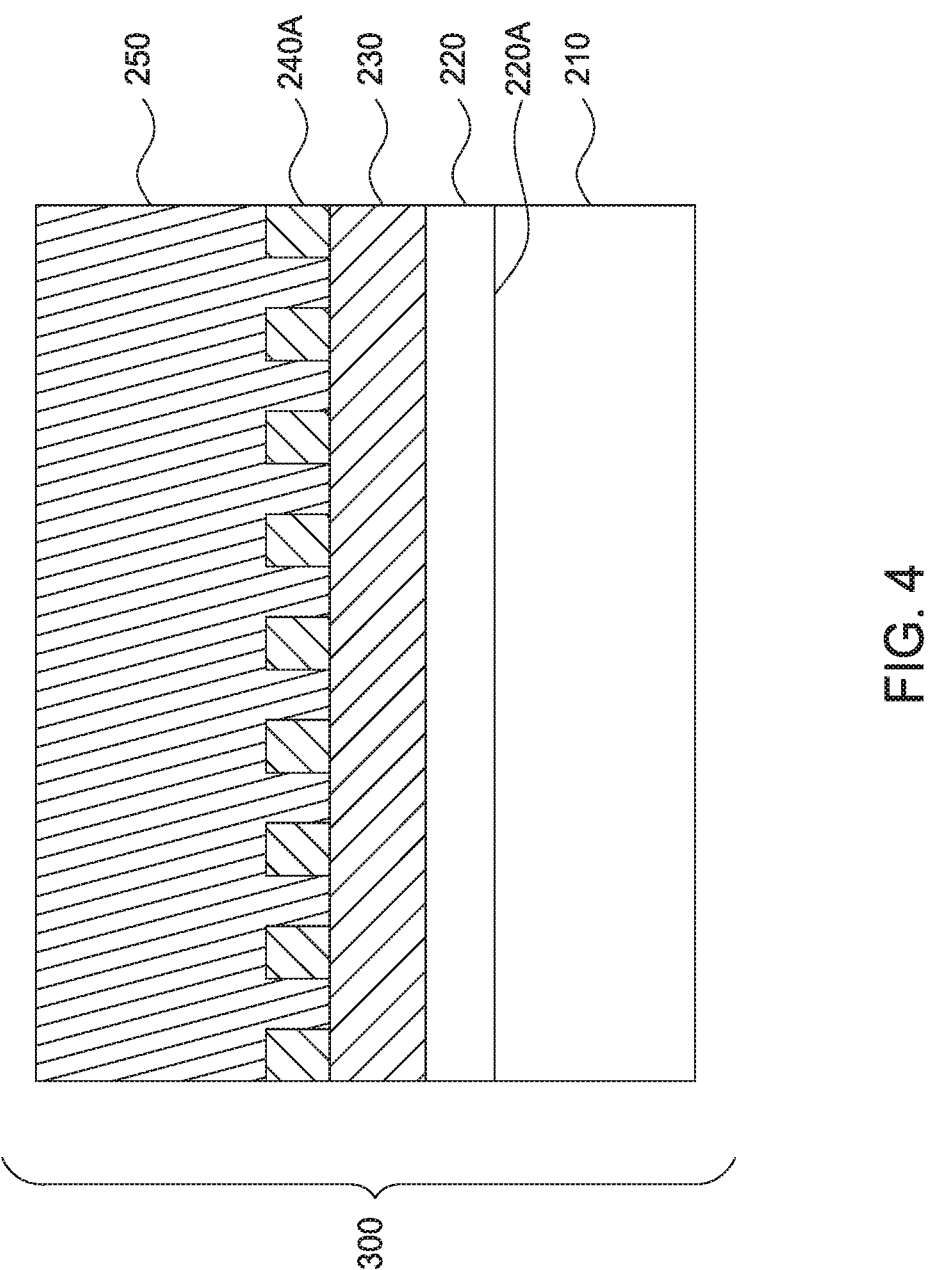
FIG. 4 illustrates a semiconductor device in accordance with at least one embodiment of the present disclosure.

FIG. 4 illustrates a structure 300 with a deposited second sacrificial layer 250, where, in one embodiment, the deposited second sacrificial material extends through the holes 240B of the porous membrane layer and contacts the sacrificial layer 230. As above, in one embodiment, the sacrificial layer 250 is deposited using a suitable process, e.g., chemical vapor deposition (CVD), physical vapor deposition (PVD), molecular beam deposition (MBD), etc. In an embodiment, the sacrificial layer 230 can be selected to match the sacrificial semiconductor material layer; for instance, both the sacrificial layer 230 and the second sacrificial layer 250 can be silicon-germanium layers. In one embodiment, ultimately, both the sacrificial layer 230 and the deposited second sacrificial layer 250 are sacrificial layers. Similar to the first sacrificial material 230, in one embodiment, the second sacrificial material 250 is sacrificial, so it can be semiconductor materials such as silicon, silicon germanium, and germanium. It can also be other materials such as a dielectric, e.g., SiCOH, that can be later removed selective to the surrounding materials. In one embodiment, the layer 250 can be a metallic material, e.g., titanium nitride.

After depositing the second sacrificial layer 250, and in order to remove any excess deposited material and/or to establish a planar surface, a chemical mechanical polishing process (CMP) can be employed on the second sacrificial layer 250.

Figure 5:
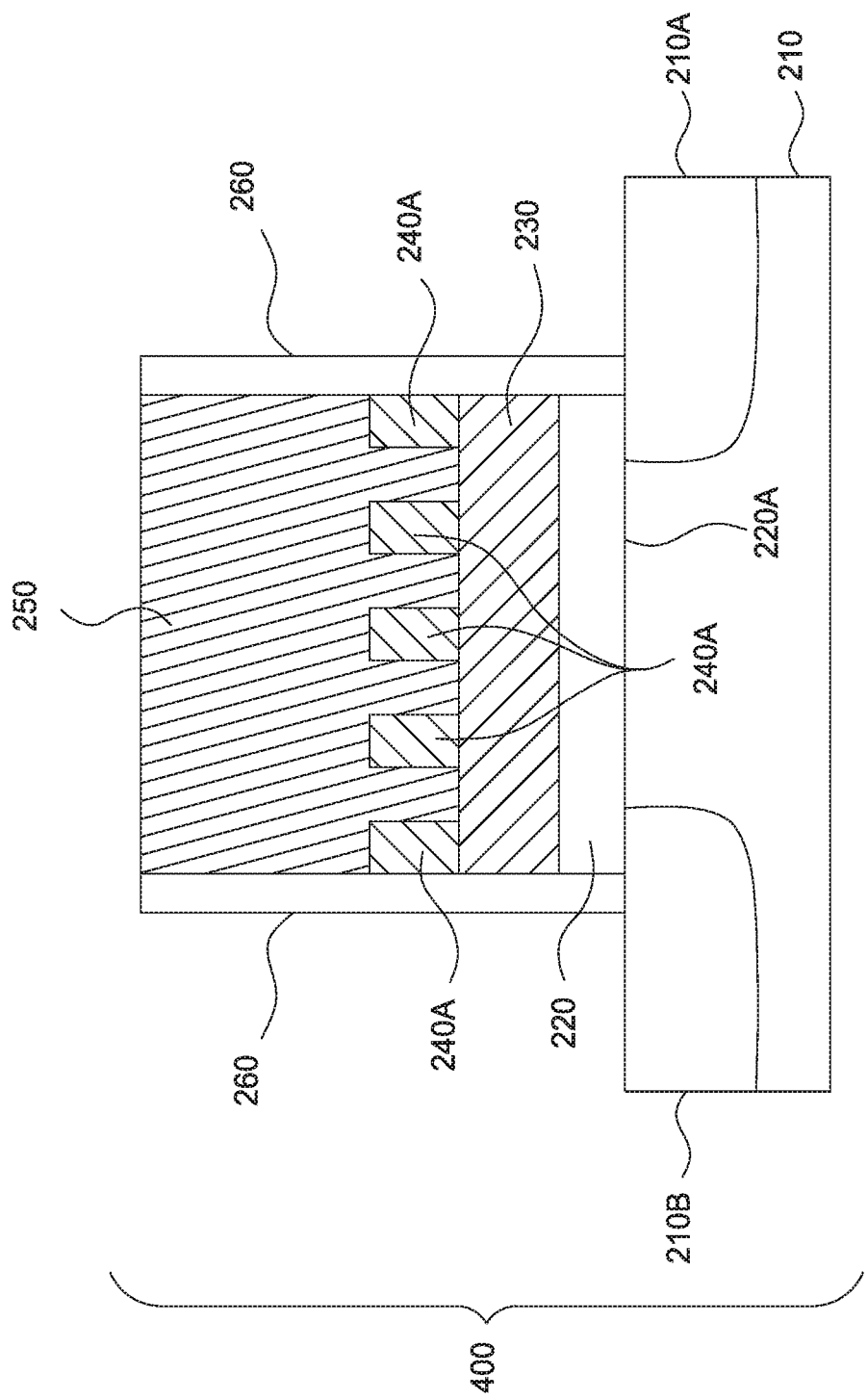
FIG. 5 illustrates a semiconductor device in accordance with at least one embodiment of the present disclosure.

FIG. 5 illustrates the structure 400, which is the structure 300 of FIG. 4 after it has undergone further fabrication steps to create an ISFET device. Specifically, the second sacrificial material layer 250 is patterned using a photolithographic and etch process to establish the gate portion of the device. To that end, in one embodiment, and similar to the process outlined above with respect to the membrane material layer 240, a resist (not shown) is exposed to radiation projected through a photomask to establish the desired patterns for surfaces and regions of the structure 400 as required.

Dielectric spacers, e.g., 260 are formed on the sidewalls of the gate dielectric 220 and the second sacrificial layer 250. The dielectric spacers 260 can be a dielectric oxide, such as for example, silicon dioxide, and/or an oxygen-impermeable dielectric material such as silicon-nitride, or a dielectric material such as SiBCN, SiOCN, SiCO, SiCN. A combination of those materials can also be used to form the dielectric spacer 260. The dielectric spacers 260 can be formed by deposition, followed by etching, where in one embodiment directional etching, e.g., RIE is employed to form the spacers.

Source/drain regions are formed in the substrate 210 using any suitable ion implantation process, which can include suitable n-type dopants and/or p-type dopants. In one embodiment, a source 210B and a drain 210A may be formed in the substrate 210 by implanting ions of a suitable n-type dopant from Group V of the Periodic Table (e.g., phosphorus, arsenic or antimony), or a suitable p-type dopant selected from Group III of the Periodic Table (e.g., boron, gallium, or indium) into the substrate 210. In one embodiment, the dopant process may use the second sacrificial material layer 250 as a self-aligning mask during ion implantation and electrically activated by an annealing step.

Figure 6:
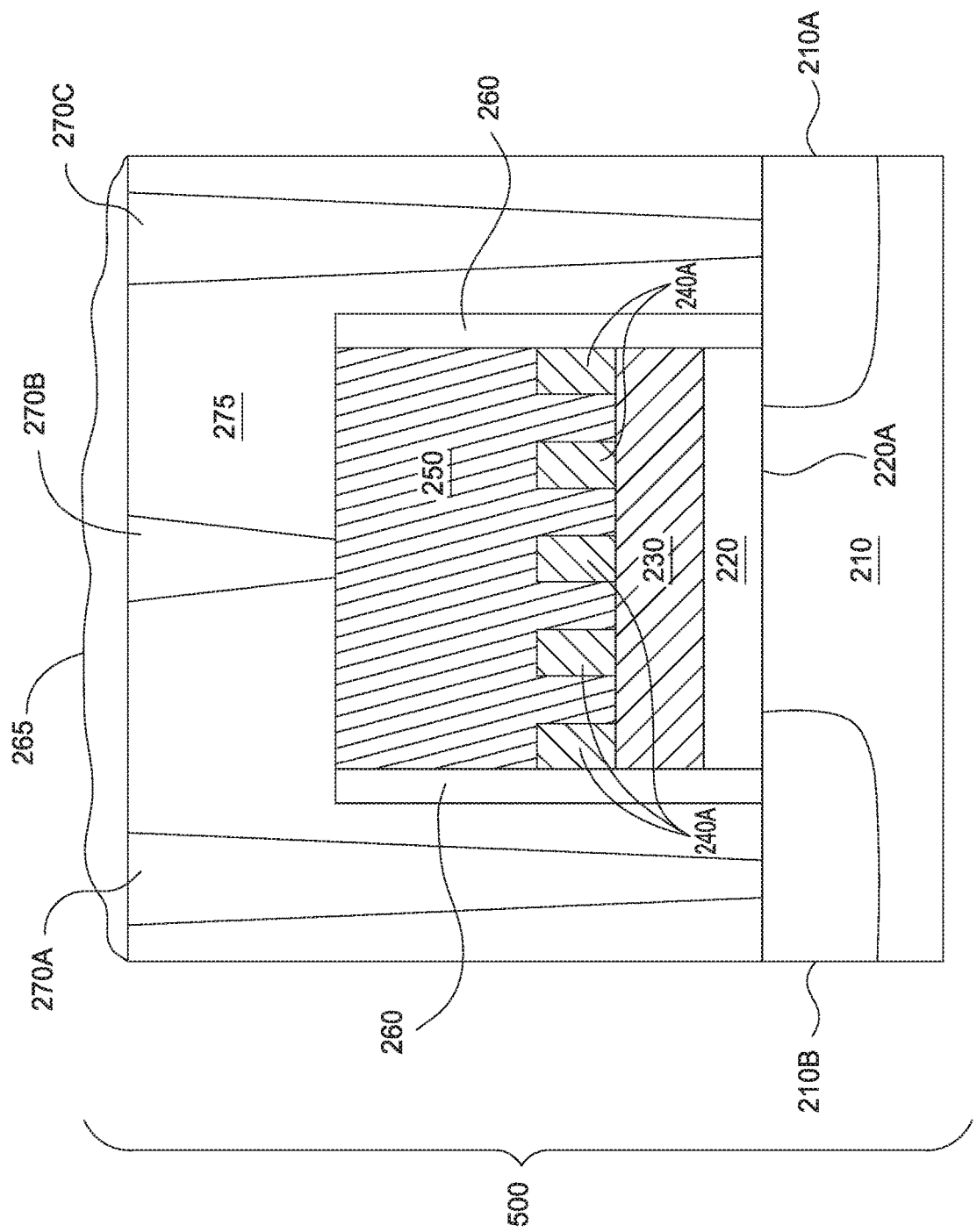
FIG. 6 illustrates a semiconductor device in accordance with at least one embodiment of the present disclosure.

FIG. 6 illustrates the structure 500, which is the structure 400 of FIG. 5 after it has undergone further fabrication steps to create an ISFET device. Specifically, FIG. 6 illustrates the structure 400 after an interconnecting layer 265 is formed thereon, resulting in structure 500. The interconnect layer 265 includes at least one interconnecting dielectric material 275 and one or more metal contacts 270A, 270B, and 270C embedded therein. The metal contacts 270A, 270B, and 270C can be in the form of trench, a via or a combination of a trench and via. The interconnect layer 275 can be formed utilizing any back-end-of-the-line process including, for example, a single damascene or a dual damascene process. The at least one dielectric material 275 can include an interconnect dielectric material including, for example, SiO2, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The at least one dielectric material 275 can be porous or non-porous. In one embodiment, at least one dielectric material 275 has a dielectric constant that is about 4.0 or less. In another embodiment, at least one dielectric material 275 has a dielectric constant of about 2.8 or less. In one embodiment, metal contact 270A is a source 210B contact, e.g., a contact that connects to the source region 210B of the substrate 210; metal contact 270B is a drain 210A contact, e.g., a contact that connects to the drain region 210A; and metal contact 270C is a gate reference electrode.

Figure 7A:
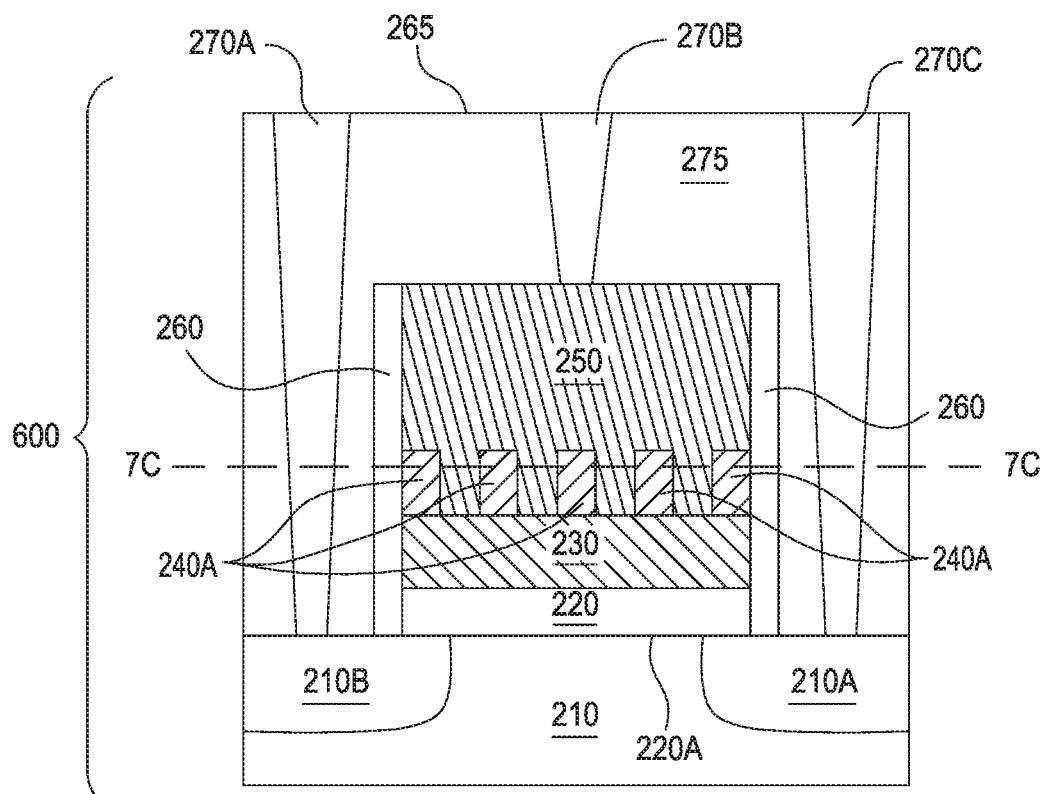
FIG. 7A illustrates a semiconductor device in accordance with at least one embodiment of the present disclosure.
Figure 7B:
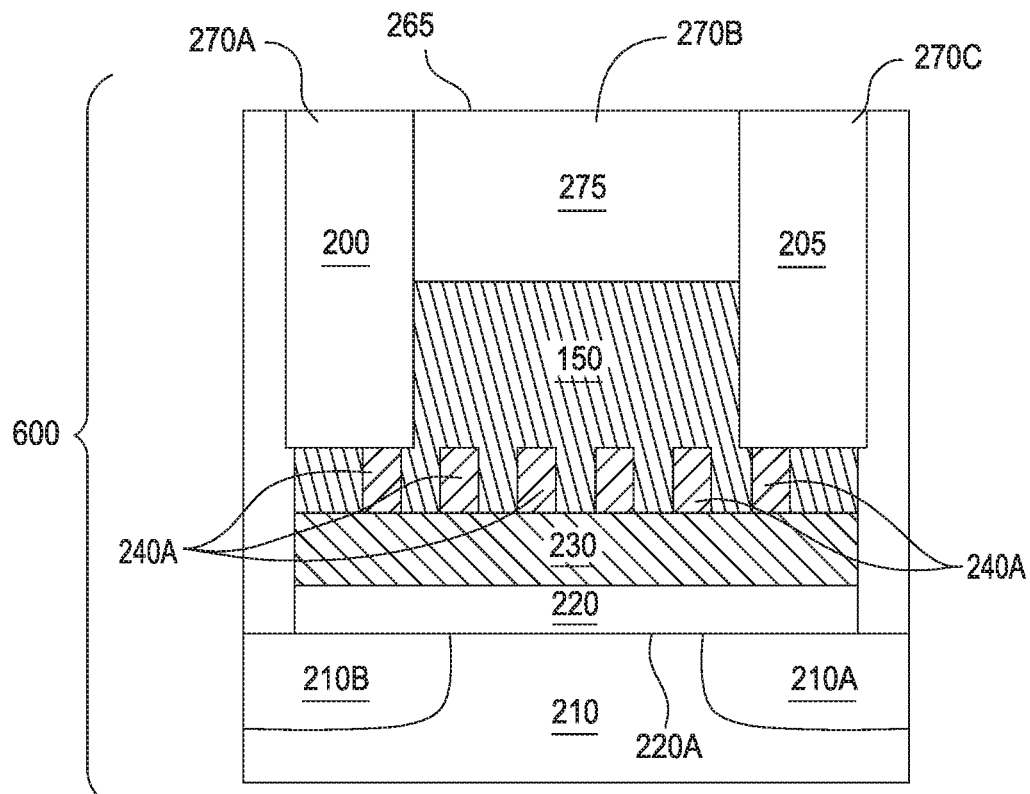
FIG. 7B illustrates a semiconductor device in accordance with at least one embodiment of the present disclosure.
Figure 7C:
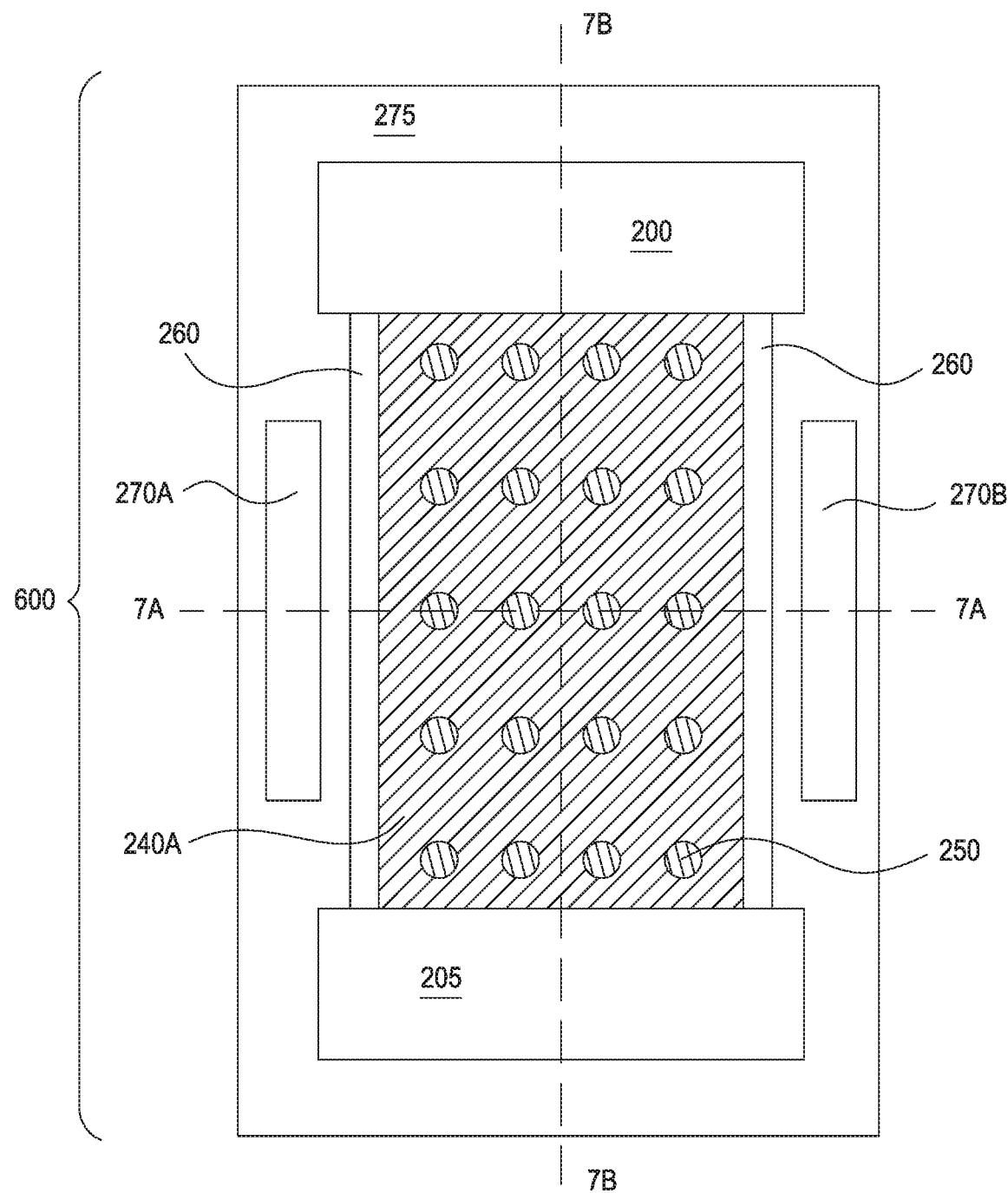
FIG. 7C illustrates a semiconductor device in accordance with at least one embodiment of the present disclosure.

FIGS. 7A, 7B, and 7C illustrate various cross-sections of the structure 600, which is the structure 500 after it has undergone further fabrication steps to create an ISFET device. Structure 600 includes one or more trenches 200, 205 formed over the interconnecting structure 265 and through at least the second sacrificial material layer 250. The one or more trenches 200, 205 are formed by a mask (not shown) and etch process, where in one embodiment, the etch is an RIE anisotropic etch, a wet etch technique, such as a wet etch technique employing hydrofluoric acid (HF). In one embodiment, at least one trench is an inlet 200 for allowing entry of a material or chemical, including a chemical suitable for selectively etching one or both the sacrificial layer 230 and the second sacrificial layer 240, and at least one trench is an outlet for the chemical or material to be released from the structure 600 and/or provides a path for the chemical solution to travel through the device, and for particles, e.g. bio-species, to eventually reach the sensor (e.g. gate dielectric) of the device.

Figure 8A:
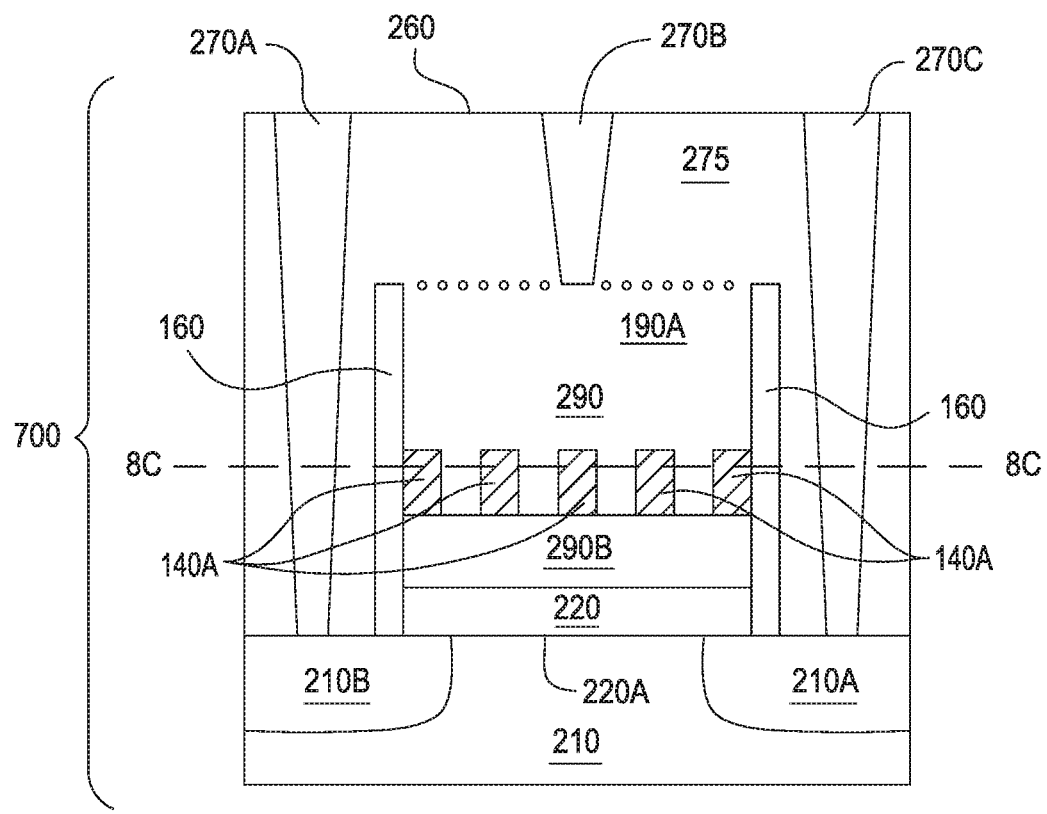
FIG. 8A illustrates a semiconductor device in accordance with at least one embodiment of the present disclosure.
Figure 8B:
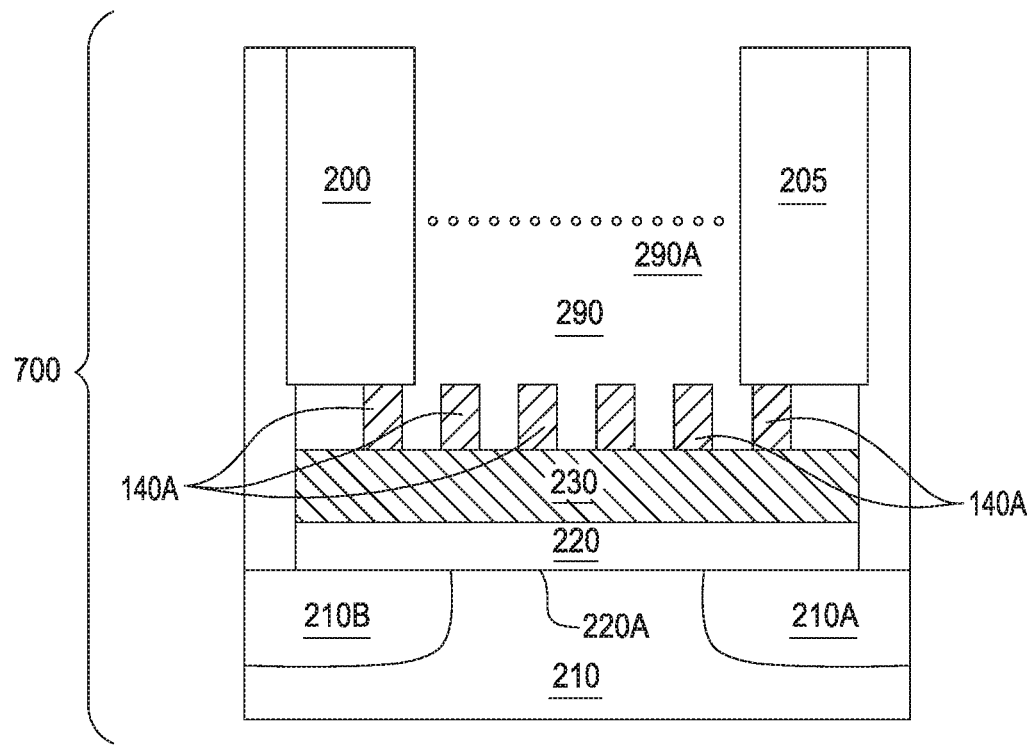
FIG. 8B illustrates a semiconductor device in accordance with at least one embodiment of the present disclosure.
Figure 8C:
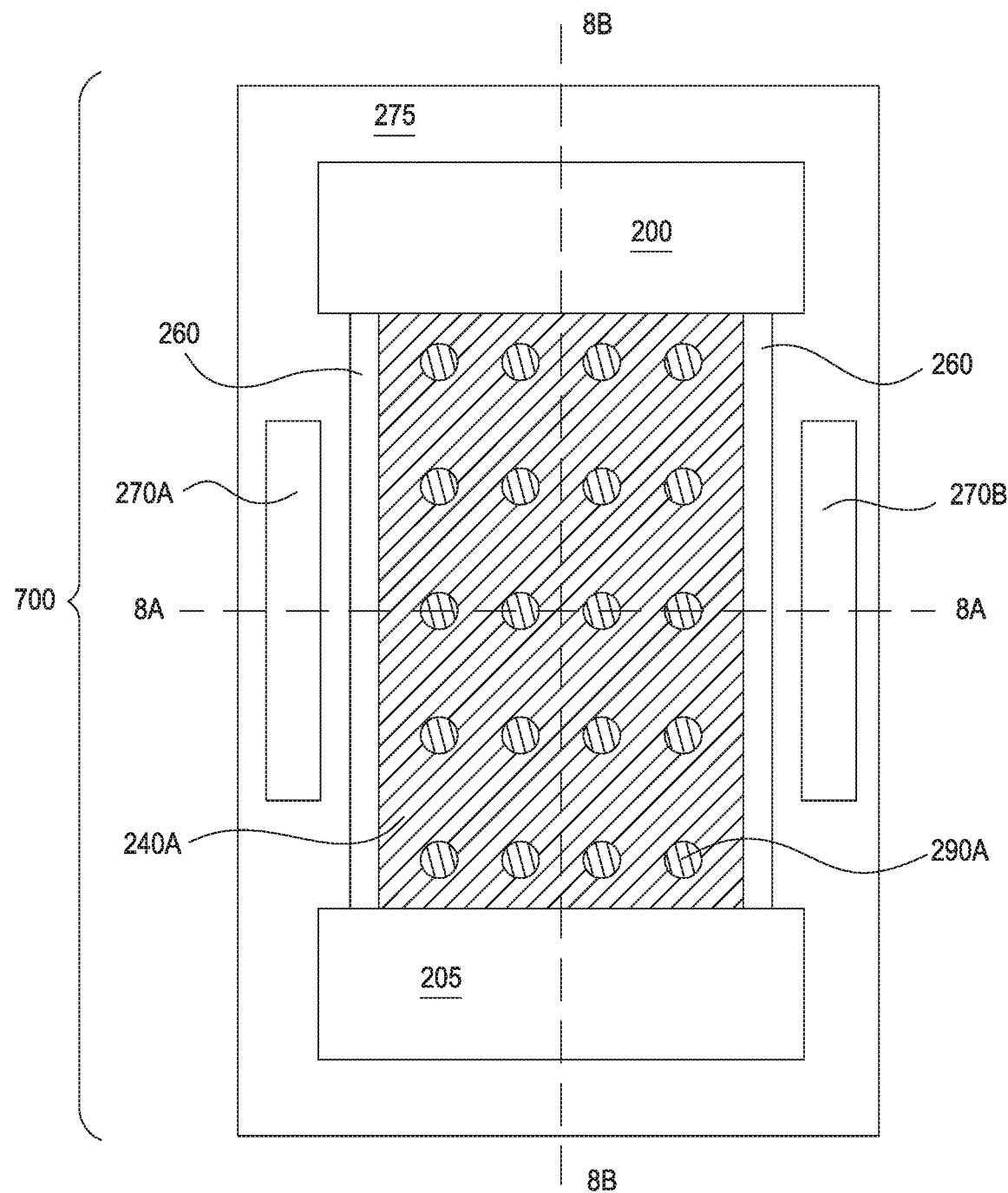
FIG. 8C illustrates a semiconductor device in accordance with at least one embodiment of the present disclosure.

FIGS. 8A, 8B, and 8C illustrate various cross-sections of the structure 700 after it has undergone further fabrication steps to create an ISFET device. Structure 700 is the structure 600 after a selective etch is applied through the trenches, such that at least the second sacrificial material layer 230 is removed, and where in one embodiment, both the second sacrificial material layer 250 and the sacrificial material layer 230 are removed, which leads to the creation of an opening 290A where the second sacrificial material layer 250 was located, and overall opening 290 which is created by the removal of both the both the second sacrificial material layer 250 and the sacrificial material layer 230. The etch process can also remove portions of the other layers of the structure 700 as required by the particular application. In one embodiment, the sacrificial materials 230 and 250 are silicon germanium. In one embodiment, a wet etch technique employing a mix of ammonia and hyperoxide can be used to selectively remove silicon geranium. In one embodiment, silicon germanium can be removed by gas phase hydrochloride.

The resulting structure 700 of FIGS. 8A, 8B, and 8C is capable of receiving a bio-species or chemical solution (not shown) with bio-species or chemical constituents included therein. Any parasitic effects from the solution are mitigated at least because of the membrane material layer 240A, which simultaneously permits entry of the bio-species or chemical solution through the relevant portions of the device, while substantially reducing the effects of parasitic capacitance associated with the bio-species or chemical solution. As a result, at least one reference material and/or section of the device, e.g., the channel 220A, will be able to better detect charges from the bio-species solution, which otherwise would have been diverted by parasitic capacitance associated with the solution.

Figure 8D:
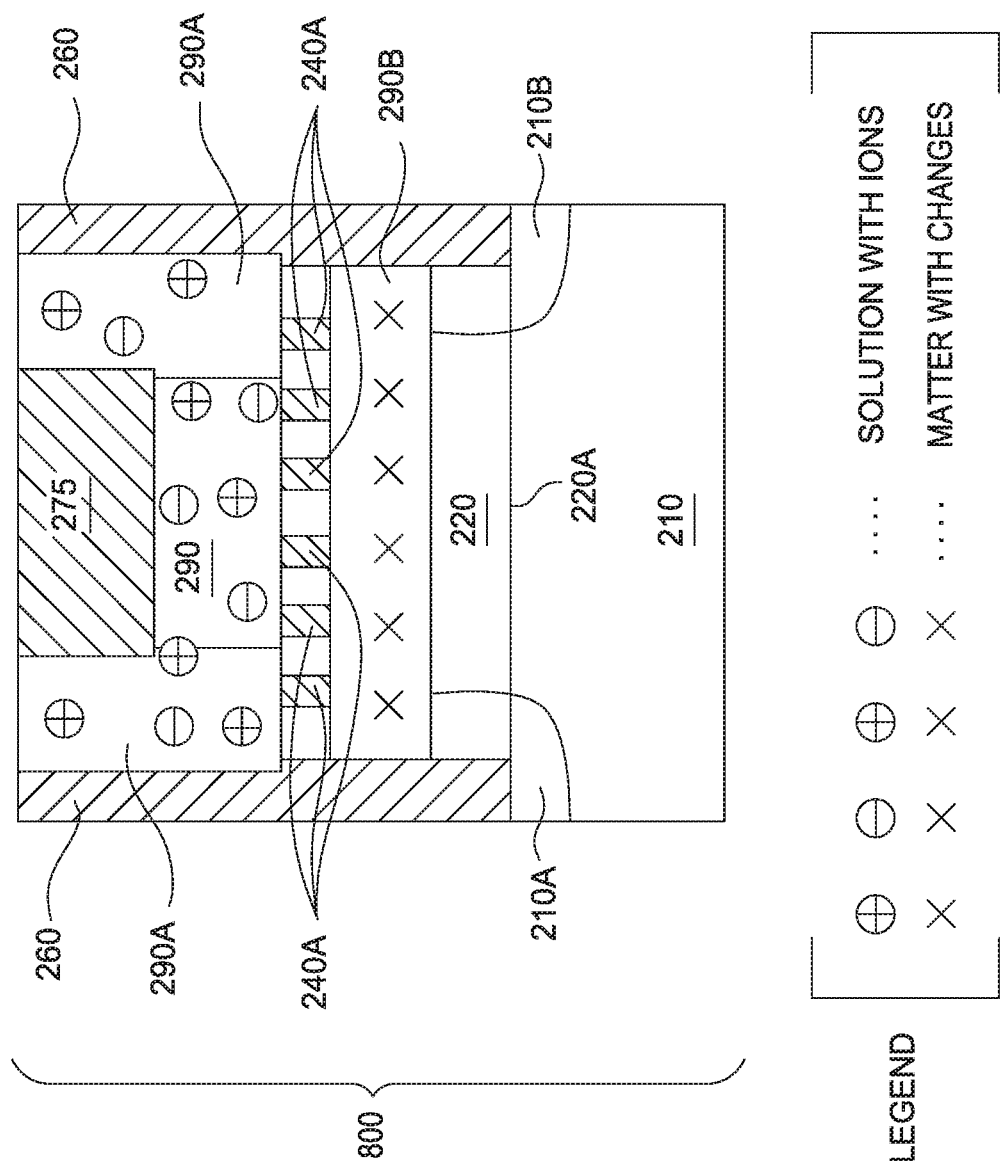
FIG. 8D illustrate a semiconductor device in accordance with at least one embodiment of the present disclosure.

FIG. 8D illustrates the structure of FIGS. 8A, 8B, and 8C after a solution with ions is transferred over the structure 700, resulting in the structure 800. The solution travels through layer, opening, or air-gap 290 and into the membrane 240A. Specifically, matter that is associated with charges, e.g., bio-species, travels through the membrane 240A and lands on the date dielectric 220. As stated herein, the pore sizes of the membrane 240A can be adjusted to accommodate the physical and electrical properties of the charged matter, and enable the matter to flow through the membrane 240A and to land on the gate dielectric 220 for sensing. In one embodiment, if there are multiple bio-species, e.g. different kinds of bio-species or chemical particulates, the membrane 240A can be adjusted to permit one type through and not the other, or it can be adjusted to allow both through the structure. As such, in one embodiment, layer, air-gap or opening 290B can be considered a charge transmission region where charged matter flows on top of the gate dielectric 220, where the opening 290B is located between the membrane 240A and the gate dielectric. The parasitic capacitance of the solution is mitigated by the membrane layer for the reasons stated herein. In one embodiment, some charges and associated solution may still remain above the membrane, as not all charges will necessarily be sensed in a call cases.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming an ion-sensitive field-effect transistor comprising:
   providing a substrate;
   depositing an insulator layer on the substrate;
   depositing a sacrificial layer on the insulator layer; and
   depositing, over the insulator layer, at least one material layer for reducing a parasitic capacitance associated with a bio-species or chemical solution that can be deposited over the insulator layer, wherein depositing the at least one material layer comprises:
      depositing a nitride layer over the insulator layer, wherein depositing the nitride layer over the insulator layer comprises depositing the nitride layer over the sacrificial layer; and etching the nitride layer to form a plurality of nitride pillars forming a porous membrane layer over the insulator layer.

2. The method of claim 1, wherein etching the nitride layer to form the plurality of nitride pillars forming the porous membrane layer further comprises forming an opening of a plurality of openings between adjacent nitride pillars of the plurality of nitride pillars over the insulating layer.

3. The method of claim 1, further comprising: depositing a second sacrificial material layer over the porous membrane layer.

4. The method of claim 3, further comprising:
forming a plurality of spacers over the substrate and in contact with the second sacrificial material layer; and
forming an interconnect structure over the second sacrificial material layer.

5. The method of claim 4, wherein the interconnect structure comprises:
i) a plurality of metal contacts in contact with at least one layer of the device and
ii) an inter-connecting dielectric layer in contact with the plurality of metal contacts and the substrate.

6. The method of claim 5, further comprising:
creating a plurality of trenches through the interconnecting dielectric layer; and
removing both the sacrificial material layer and the second sacrificial material layer by applying an etchant through the plurality of trenches, wherein the porous membrane layer is a silicon-nitride layer, and wherein the sacrificial layer and the second sacrificial material layer are both silicon-germanium layers.

7. A method for forming an ion-sensitive field-effect transistor comprising:
providing a substrate;
depositing an insulator layer on the substrate;
depositing a sacrificial layer on the insulator layer;
depositing, after the sacrificial layer and over the insulator layer, at least one material layer for reducing a parasitic capacitance associated with a bio-species or chemical solution that can be deposited over the insulator layer, wherein depositing the at least one material layer comprises:
depositing a nitride layer over the insulator layer;
etching the nitride layer to form a plurality of nitride pillars forming a porous membrane layer over the insulator layer; and
depositing a second sacrificial material layer over the porous membrane layer.

8. The method of claim 7, wherein depositing the nitride layer over the insulator layer comprises depositing the nitride layer over the sacrificial layer.

9. The method of claim 7, wherein etching the nitride layer to form the plurality of nitride pillars forming the porous membrane layer further comprises forming an opening of a plurality of openings between adjacent nitride pillars of the plurality of nitride pillars over the insulating layer.

10. The method of claim 7, further comprising:
forming a plurality of spacers over the substrate and in contact with the second sacrificial material layer; and
forming an interconnect structure over the second sacrificial material layer.

11. The method of claim 10, wherein the interconnect structure comprises:
i) a plurality of metal contacts in contact with at least one layer of the device; and
ii) an inter-connecting dielectric layer in contact with the plurality of metal contacts and the substrate.

12. The method of claim 11, further comprising:
creating a plurality of trenches through the interconnecting dielectric layer; and
removing both the sacrificial material layer and the second sacrificial material layer by applying an etchant through the plurality of trenches, wherein the porous membrane layer is a silicon-nitride layer, and wherein the sacrificial layer and the second sacrificial material layer are both silicon-germanium layers.

* * * * *